United States Patent
Yoon et al.

(10) Patent No.: US 7,629,685 B2
(45) Date of Patent: Dec. 8, 2009

(54) SEMICONDUCTOR DEVICE PACKAGE

(75) Inventors: Young Bok Yoon, Kyungki-do (KR); Dong Jin Kim, Seoul (KR); Jin Woo Park, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 441 days.

(21) Appl. No.: 11/585,828

(22) Filed: Oct. 25, 2006

(65) Prior Publication Data
US 2007/0096343 A1 May 3, 2007

(30) Foreign Application Priority Data
Oct. 31, 2005 (KR) ............... 10-2005-0103203

(51) Int. Cl.
*H01L 23/06* (2006.01)
(52) U.S. Cl. ............... 257/729; 257/730; 257/E23.002
(58) Field of Classification Search ................ 257/737, 257/678, 729, 730, E23.002, E23.003, E23.191
See application file for complete search history.

(56) References Cited

U.S. PATENT DOCUMENTS

2003/0003287 A1* 1/2003 Tobita ................ 428/297.4
2003/0168720 A1* 9/2003 Kamada ................ 257/666

* cited by examiner

*Primary Examiner*—Roy K Potter
(74) *Attorney, Agent, or Firm*—McDermott Will & Emery LLP

(57) ABSTRACT

Disclosed is a semiconductor device package. The semiconductor device package includes at least one semiconductor device acting as a heating source, a package substrate having an upper surface on which the semiconductor device is mounted, the package substrate at least having a higher heat conductivity than that of the semiconductor device, and a fiber-reinforced polymer composite formed to surround a side surface of the package substrate, the polymer composite including fibers acting as a reinforcing material and a resin mass embedding the fibers therein.

7 Claims, 4 Drawing Sheets (a)

Thermal stress 
LOW                                    HIGH (b)

Thermal stress 
LOW                                    HIGH

SEMICONDUCTOR DEVICE PACKAGE

RELATED APPLICATIONS

The present application is based on, and claims priority from, Korean Application No. 2005-103203, filed on Oct. 31, 2005, the disclosure of which is incorporated by reference herein in its entirety.

BACKGROUND OF THE INVENTION

1. Field of the Invention

The present invention relates to a semiconductor device package, and more particularly, to a semiconductor device package, which can restrict a thermal stress caused between a semiconductor device that acts as a heating source and a package substrate that acts as a heat sink, and achieve an improvement in a heat emission property thereof.

2. Description of the Related Art

Generally, semiconductor device packages for light emitting diodes, laser diodes, or the like are designed and manufactured to fulfill the purpose of efficient emission of heat generated from semiconductor devices. In particular, since high-power light emitting diode packages used in the field of illumination emit a great amount of heat, a heat emission property is very important to the high-power light emitting diode packages.

To achieve an improvement in a heat emission property, it is generally proposed to use a package substrate, which is made of a material having a higher heat conductivity than that of constituent materials of a semiconductor device. FIG. 1 illustrates a simple exemplary configuration of a conventional light emitting diode package.

As shown in FIG. 1, the conventional light emitting diode package 10 comprises a package substrate 17 and at least one light emitting diode 15 mounted on an upper surface of the package substrate 17. The light emitting diode 15 includes a first conductive semiconductor layer 12, an active layer 13, and a second conductive semiconductor layer 14, which are laminated on a substrate 11 in this sequence from the bottom. The first and second conductive semiconductor layers 12 and 14 are provided thereon with first and second electrodes 16a and 16b, respectively, and in turn, the first and second electrodes 16a and 16b are connected to first and second bonding pads 18a and 18b on the package substrate 17 by use of wires.

The package substrate 17 is made of a material having a higher heat conductivity than that of constituent materials of the light emitting diode 15, and may be a silicon semiconductor substrate, ceramic substrate, or metal substrate. With the use of the material having a higher heat conductivity, the package substrate 17 can serve to emit heat generated from the light emitting diode 15 (as represented by dotted arrows).

However, the package substrate 17 having the higher heat conductivity also has a higher thermal expansion coefficient than that of the constituent materials of the light emitting diode 15. Therefore, when the package substrate 17 is cooled after being exposed to heat during a light emitting diode attachment process or driving process, an intensive thermal stress is generated at an interface between the light emitting diode 15 and the package substrate 17 as represented by arrows. The thermal stress may cause deterioration in the reliability of the light emitting diode 15, and in the worst case, may cause cracks in the light emitting diode 15, resulting in defective products.

To reduce the thermal stress generated at the interface, conventionally, a buffer material layer L has been employed between the light emitting diode 15 and the package substrate 17, as shown in FIG. 1. However, this solution is problematic because the buffer material layer L should be formed in a heat transfer path, although the buffer material layer L is preferable thermal stress reducing means. In other words, providing the buffer material layer L may cause deterioration in a heat emitting function of the package substrate.

SUMMARY OF THE INVENTION

Therefore, the present invention has been made in view of the above problems, and it is an object of the present invention to provide a semiconductor device package, which can restrict thermal expansion of a package substrate by use of a fiber-reinforced polymer composite, thereby achieving a reduction in thermal stress generated at an interface between the package substrate and a semiconductor device.

In accordance with the present invention, the above and other objects can be accomplished by the provision of a semiconductor device package comprising: at least one semiconductor device acting as a heating source; a package substrate having an upper surface on which the semiconductor device is mounted, the package substrate at least having a higher heat conductivity than that of the semiconductor device; and a fiber-reinforced polymer composite formed to surround a side surface of the package substrate, the polymer composite including fibers acting as a reinforcing material and a resin mass embedding the fibers therein.

Preferably, the fibers included in the fiber-reinforced polymer composite may correspond to 30%~80% of the total volume of the composite.

Preferably, the fibers may be carbon, graphite, or glass fibers, but not limited thereto. More preferably, carbon fibers or graphite fibers having a high heat conductivity may be used to provide the package substrate with a heat emitting function. The resin mass may be composed of an epoxy resin, silicon resin, polyester resin, or vinyl-ester resin.

Preferably, the fibers included in the fiber-reinforced polymer composite may be wound along the side surface of the package substrate. The fiber-reinforced polymer composite having the winding structure of fibers can show enhanced inward expansion during a thermal expansion thereof, thereby acting to more efficiently restrict thermal expansion of the package substrate. Preferably, the fibers may be wound obliquely to have a predetermined inclination angle on the basis of the upper surface or lower surface of the package substrate. Through the fibers having a superior heat conductivity, it is possible to efficiently emit heat of the semiconductor device located on the upper surface of the package substrate.

Preferably, the package substrate may be a semiconductor substrate, ceramic substrate, or metal substrate. The present invention is available to packages including light emitting diode chips or laser diode chips having a great amount of heat emission.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, the present invention will be explained in more detail with reference to the accompanying drawings.

Figure 2:
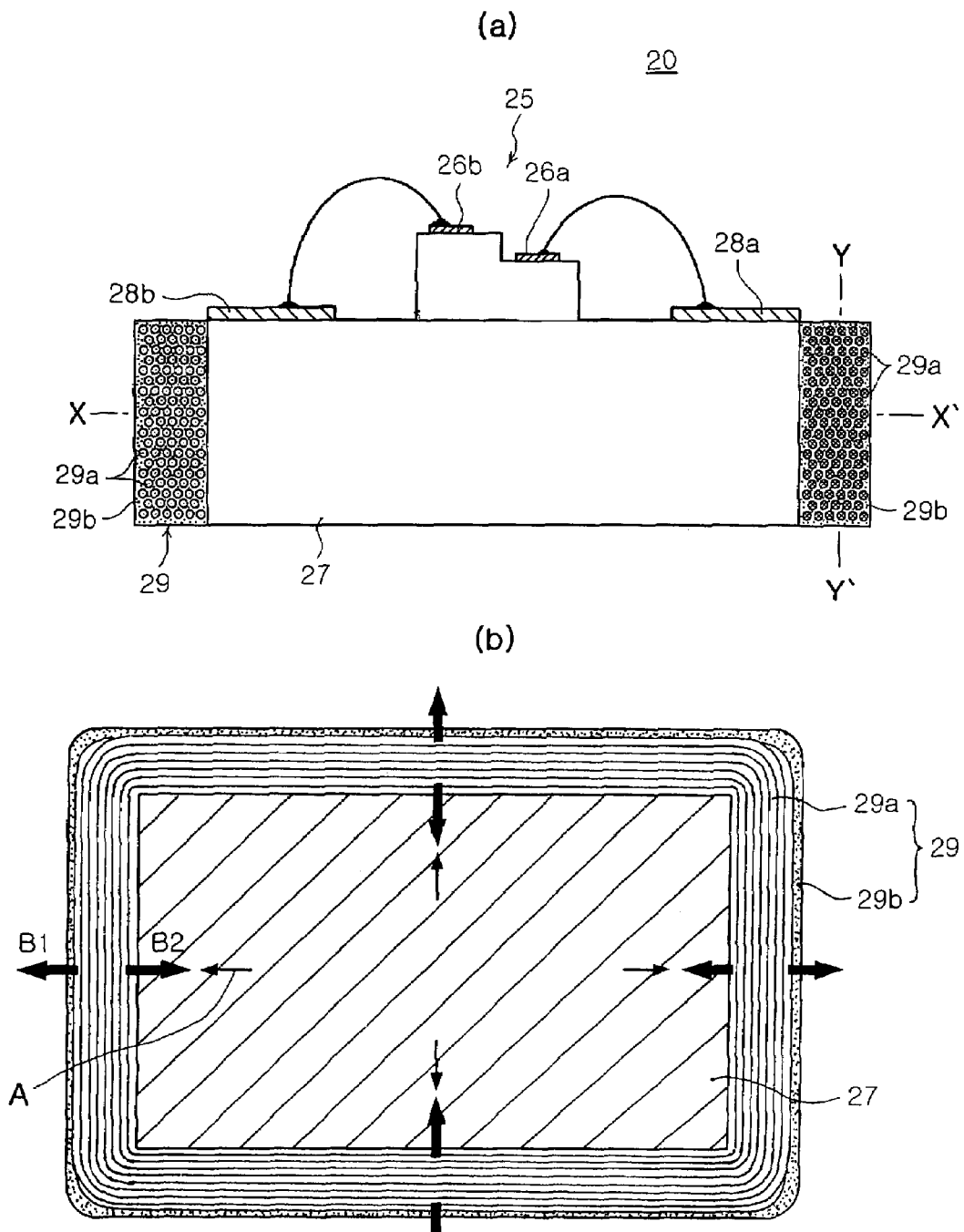
FIG. 2A is a side sectional view illustrating the configuration of a semiconductor device package according to an embodiment of the present invention.
FIG. 2B is a cross sectional view taken along the direction X-X' of FIG. 2A.

FIG. 2A is a side sectional view illustrating the configuration of a semiconductor device package according to an embodiment of the present invention. FIG. 2B is a cross sectional view taken along the direction X-X' of FIG. 2A.

Referring first to FIG. 2A, the semiconductor device package, more particularly, light emitting diode package 20 according to the embodiment of the present invention comprises a package substrate 27 and at least one semiconductor device 25 mounted on an upper surface of the package substrate 27.

Figure 1:
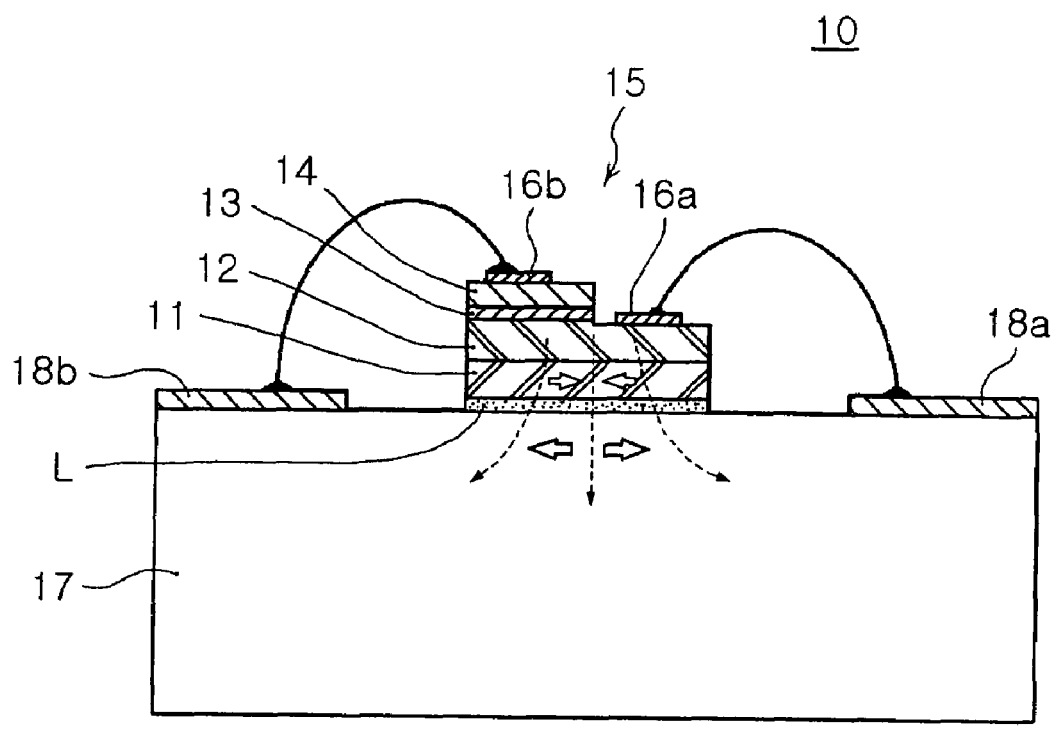
FIG. 1 is a side sectional view illustrating the configuration of a conventional semiconductor light emitting device package.

Although the semiconductor device 25 of the present embodiment shows a light emitting diode similar to that of FIG. 1, the semiconductor device 25 is not limited thereto, and may be another semiconductor device having a great amount of heat emission, such as a laser diode.

The package substrate 27 may be made of a material having a higher heat conductivity than that of the semiconductor device 25, but not limited thereto, and may be a silicon semiconductor substrate, ceramic substrate, or metal substrate. The package substrate 27 may have an appropriate wiring structure including bonding pads 28a and 28b connected, respectively, to two electrodes 26a and 26b of the semiconductor device 25. When the package substrate 27 is made of an electrically conductive material, the wiring structure including the bonding pads 28a and 28b can be insulated from the substrate 27 by use of an insulating layer (not shown) of a known technology.

A fiber-reinforced polymer composite 29 is formed to surround a side surface of the package substrate 27. The fiber-reinforced polymer composite 29 includes fibers 29a serving as a reinforcing material and a resin mass 29b embedding the fibers 29a therein. The composite 29 can achieve a high rigidity by virtue of the fibers 29a. In a state wherein the fiber-reinforced polymer composite 29 having a high rigidity surrounds the side surface of the package substrate 27, thermal expansion of the package substrate 27 can be restricted even under high-temperature conditions, such as a device attachment or driving process. As a result, it becomes possible to achieve a considerable reduction in thermal stress that may be caused by a difference between thermal expansion coefficients of the semiconductor device 25 and package substrate 27.

The fiber-reinforced polymer composite 29, employed in the present embodiment, is configured in such a manner that the fibers 29a are embedded in the resin mass 29b to be wound along the side surface of the package substrate 27. As shown in FIG. 2B, the wound fibers 29b have characteristics of simultaneous outward and inward expansion under a high-temperature condition, and therefore, can act to more efficiently restrict thermal expansion of the package substrate 27.

The fiber-reinforced polymer composite 29 having the above described winding structure of the fibers 29a may be formed via a known filament winding method. Specifically, after a polymer resin mass is adhered to the previously prepared fibers 29a, the fibers 29a are wound around the package substrate 27. Subsequently, by curing the resin, the fiber-reinforced polymer composite 29 having a structure as shown in FIGS. 2A and 2B can be obtained.

Preferably, the content of the fibers 29a included in the fiber-reinforced polymer composite 29 is 30~80% of the total volume of the composite 29. If the content of the fibers 29a is below 30%, it is difficult to ensure a sufficient thermal-expansion restriction effect. Conversely, if the content of the fibers 29a is above 80%, the content of the resin 29b decreases relatively, and this makes it difficult for the composite 29 to be strongly attached to the package substrate 27.

The resin mass 29b used in the fiber-reinforced polymer composite 29 may be composed of epoxy resin, silicon resin, polyester resin, or vinyl-ester resin. Also, the fibers 29a may be one of known fibers, such as carbon fibers, graphite fibers, and glass fibers, and preferably, may be carbon fibers or graphite fibers having a high heat conductivity.

Figure 3:
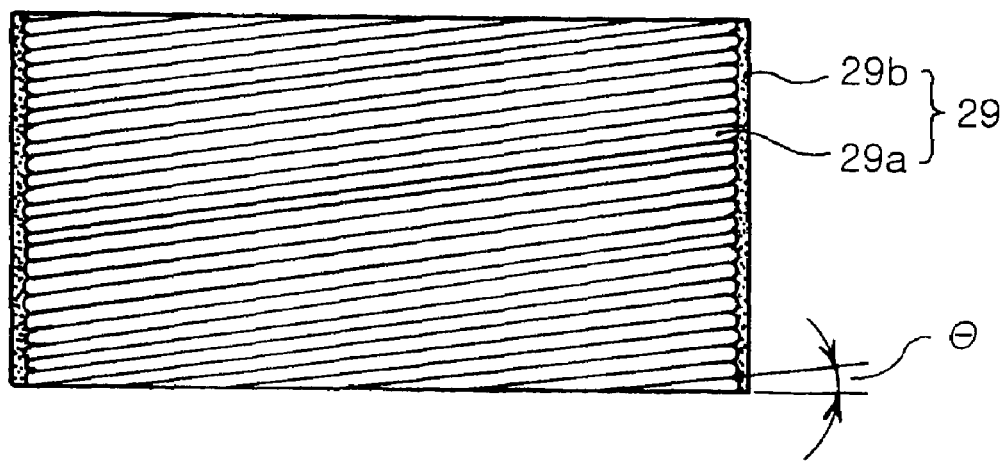
FIG. 3 is a longitudinal sectional view taken along the direction Y-Y' of FIG. 2A, illustrating a package substrate.

To achieve an improvement in a heat emission property, the fiber-reinforced polymer composite 29 employed in the present invention may be wound in such a manner that the fibers 29a have a predetermined gradient as shown in FIG. 3. It can be appreciated that FIG. 3 is a longitudinal sectional view taken by cutting the package substrate 27 along the direction Y-Y' of FIG. 2A.

When being wound to have a predetermined inclination angle θ, the fibers 29a are located close to an upper surface region of the package substrate 27 where the semiconductor device 25 is mounted. In this case, the fibers 29a can serve as an effective heat transfer path. It can be appreciated that the configuration of FIG. 3 is obtained by forming a fiber-reinforced polymer composite around a bar-shaped package substrate material via the above described filament winding method, and cutting the bar-shaped package substrate to obtain the package substrate 27 having an appropriate thickness.

Now, a computer simulation, which was performed under the following conditions to show a thermal stress restriction effect by the fiber-reinforced polymer composite according to the present invention, will be explained.

In the computer simulation, it was assumed that two package substrates, which are made of copper and have a diameter of 2 mm, are prepared, and a fiber-reinforced polymer composite is formed along a side surface of only one of the package substrates via a filament winding process according to the present invention. Here, the fiber-reinforced polymer composite includes carbon fibers (product name: T300/5208) and an epoxy resin mass, and the fiber-reinforced polymer composite has a thickness of 2 mm (total diameter of the resulting package substrate is 4 mm). Also, it was assumed that the content of the carbon fibers is approximately 70% of the total volume of the polymer composite.

After mounting nitride semiconductor light emitting diodes on the two package substrates, respectively, the package substrates were exposed to a high-temperature condition. Thereafter, a thermal stress applied to the nitride semiconductor light emitting diodes was observed via a computer simulation.

Figure 4:
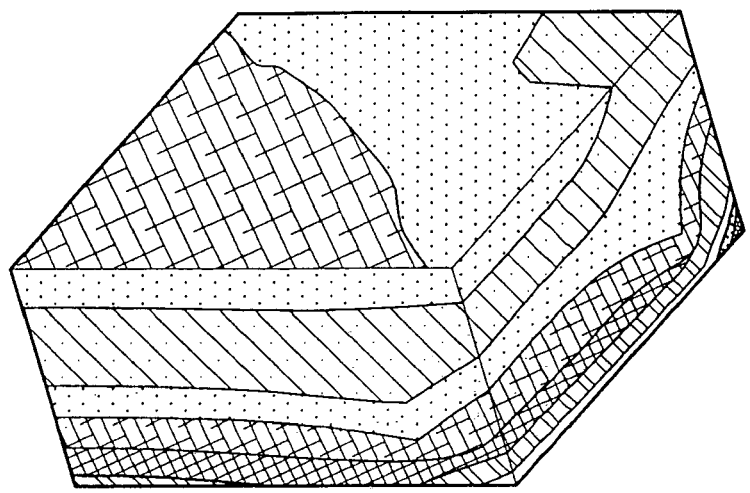
FIGS. 4A and 4B are simulation views illustrating a difference of thermal stress applied to a semiconductor device depending on the provision of a fiber-reinforced polymer composite.
Figure 4:
Figure 4:
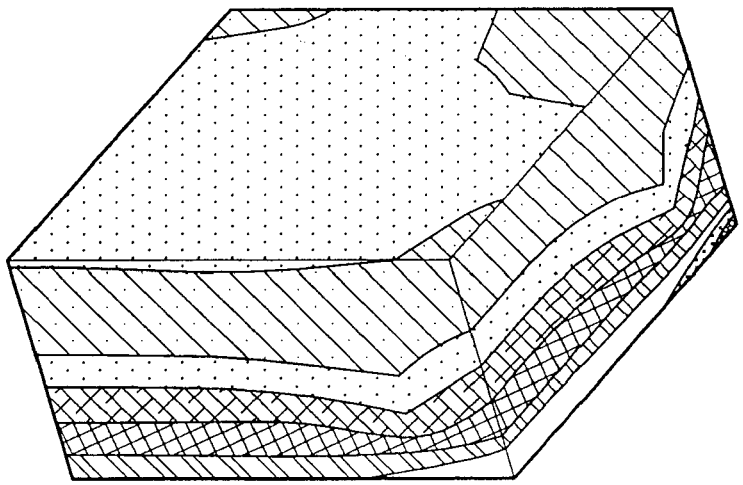
Figure 4:
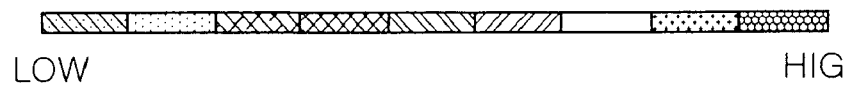

FIGS. 4A and 4B illustrate results of the above described computer simulation. In FIGS. 4A and 4B, a red portion at the right side of a bar represents a high stress state, and thus, it will be appreciated that the stress decreases toward the left side of the bar.

As compared to a conventional configuration having no fiber-reinforced polymer composite as shown in FIG. 4A, the package of the present invention as shown in FIG. 4B is generally in a relatively low stress state. Accordingly, it can be appreciated that thermal expansion of the package substrate is restricted by the fiber-reinforced polymer composite surrounding the side surface of the package substrate.

Figure 5:
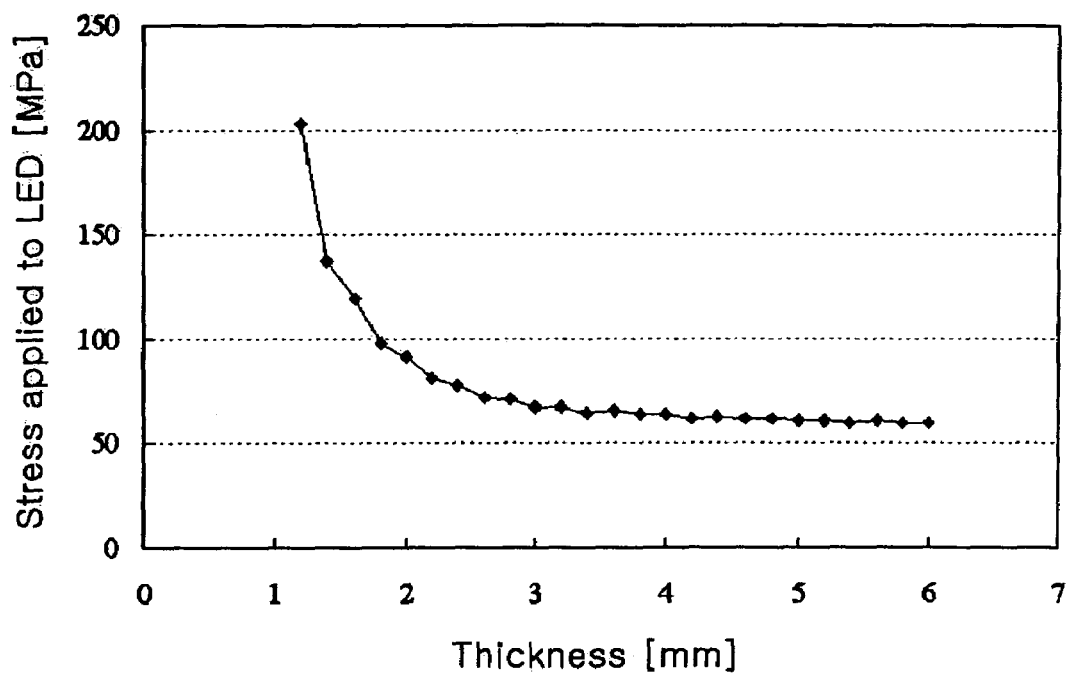
FIG. 5 is a graph illustrating a variation of stress applied to a semiconductor device depending on a thickness of a fiber-reinforced polymer composite.

Also, under the same conditions as those of the above described simulation, a thermal stress applied to the light emitting diodes was calculated while increasing the thickness of the fiber-reinforced polymer composite, and the calculated results are shown in the graph of FIG. 5. In the graph, the thickness of the abscissa represents a radius of the package substrate including the fiber-reinforced polymer composite. Accordingly, since the radius of the package substrate is 1 mm under the above described conditions, it will be appreciated that the thickness of the fiber-reinforced polymer composite is approximately 3 mm at a portion of the graph where the thickness of the abscissa indicates 4 mm.

As can be understood from FIG. 5, if the thickness of the package substrate is 1 mm, i.e. the package substrate has no fiber-reinforced polymer composite, a high stress up to 200 Mpa was applied to the light emitting diode. However, if the fiber-reinforced polymer composite has a thickness of 1 mm, the thermal stress was reduced to approximately 70 Mpa. Furthermore, if the thickness of the package substrate is more than 2 mm, the stress was reduced to approximately 60 Mpa.

As apparent from the above description, according to the present invention, as a result of forming a fiber-reinforced polymer composite along a side surface of a package substrate, it is possible to restrict thermal expansion of the substrate. As a result, the present invention can achieve a reduction in a thermal stress to be generated at an interface between a semiconductor device and the package substrate. Furthermore, the fiber-reinforced polymer composite can act as an additional heat sink, thus achieving a more efficient heat emission effect.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device package comprising:
    at least one semiconductor device acting as a heating source;
    a package substrate having an upper surface on which the semiconductor device is mounted, the package substrate at least having a higher heat conductivity than that of the semiconductor device; and
    a fiber-reinforced polymer composite formed to surround a side surface of the package substrate, the polymer composite including fibers acting as a reinforcing material and a resin mass embedding the fibers therein,
    wherein the fibers included in the fiber-reinforced polymer composite are wound along the side surface of the package substrate.

2. The package according to claim 1, wherein the fibers included in the fiber-reinforced polymer composite correspond to 30%-80% of the total volume of the composite.

3. The package according to claim 1, wherein the fibers are carbon, graphite, or glass fibers.

4. The package according to claim 1, wherein the resin mass is composed of an epoxy resin, silicon resin, polyester resin, or vinyl-ester resin.

5. The package according to claim 1, wherein the fibers are wound obliquely to have a predetermined inclination angle on the basis of the upper surface or lower surface of the package substrate.

6. The package according to claim 1, wherein the semiconductor device is a light emitting diode chip, or laser diode chip.

7. The package according to claim 1, wherein the package substrate is a semiconductor substrate, ceramic substrate, or metal substrate.

* * * * *